(12) United States Patent
Ciubotaru

(10) Patent No.: US 10,812,018 B2
(45) Date of Patent: Oct. 20, 2020

(54) START-UP CIRCUIT FOR SINGLE-PIN CRYSTAL OSCILLATORS

(71) Applicant: Arm Limited, Cambridge (GB)

(72) Inventor: Alexandru Aurelian Ciubotaru, Coconut Creek, FL (US)

(73) Assignee: Arm Limited, Cambridge (GB)

(*) Notice: Subject to any disclaimer, the term of this patent is extended or adjusted under 35 U.S.C. 154(b) by 0 days.

(21) Appl. No.: 16/205,543

(22) Filed: Nov. 30, 2018

(65) Prior Publication Data

US 2020/0177125 A1 Jun. 4, 2020

(51) Int. Cl.
| | |
|---|---|
| H03B 5/06 | (2006.01) |
| H03B 5/32 | (2006.01) |
| H03L 5/02 | (2006.01) |
| H03L 3/00 | (2006.01) |

(52) U.S. Cl.
CPC .............. *H03B 5/06* (2013.01); *H03B 5/32* (2013.01); *H03L 3/00* (2013.01); *H03L 5/02* (2013.01); *H03B 2200/0058* (2013.01); *H03B 2200/0094* (2013.01)

(58) Field of Classification Search
CPC ... H03L 3/00; H03L 5/02; H03L 5/364; H03L 5/06; H03L 5/32; H03B 5/06; H03B 5/32; H03B 2200/0094; H03B 2200/0058
USPC .................................. 331/158, 116 FE, 185
See application file for complete search history.

(56) References Cited

U.S. PATENT DOCUMENTS

| | | | | | |
|---|---|---|---|---|---|
| 4,704,587 | A | * | 11/1987 | Ouyang | ............... H03L 3/00 331/116 FE |
| 7,109,813 | B2 | * | 9/2006 | Pan | ............... H03B 5/06 331/116 FE |
| 2005/0083139 | A1 | * | 4/2005 | Gazit | ............... H03B 5/06 331/158 |
| 2006/0267704 | A1 | | 11/2006 | Stevenson et al. | |
| 2011/0037527 | A1 | | 2/2011 | Shrivastava et al. | |
| 2012/0126907 | A1 | | 5/2012 | Nakamoto et al. | |
| 2019/0074840 | A1 | * | 3/2019 | Ciubotaru | ............... H03L 5/02 |

OTHER PUBLICATIONS

Van den Homberg, J.A.T.M., "A Universal 0.03-mm# One-Pin Crystal Oscillator in CMOS", IEEE J. Solid-State Circuits, pp. 956-961, Jul. 1999, vol. 34, No. 7.
Maekawa, T. et al., "Design of CMOS inverter-based output buffers adapting the Cherry-Hopper broadbanding technique", 2009 European Conference on Circuit Theory and Design, pp. 511-514.

(Continued)

*Primary Examiner* — Arnold M Kinkead
(74) *Attorney, Agent, or Firm* — Leveque IP Law, P.C.

(57) ABSTRACT

An oscillator start-up circuit and methodology for oscillator start-up is disclosed. The circuit includes a reference bias switch coupled to a reference node and a load node of a transconductor of an oscillator. The reference bias switch is responsive to a control signal for start-up of the oscillator and operable to close at a first time prior to start-up of the oscillator to maintain a voltage at the reference node equal to a voltage at the load node prior to application of bias to the transconductor. The reference bias switch is further operable to open at a second time subsequent to the first time. In one embodiment, a separate reference bias voltage is applied to a reference node of the transconductor.

15 Claims, 11 Drawing Sheets

(56) References Cited

OTHER PUBLICATIONS

Fairchild Semiconductor, AN-88, "CMOS Linear Applications," https://www.fairchildsemi.com/application-notes/AN/AN-88.pdf, Fairchild Semiconductor. Application Note. Jul. 1973. Revised Apr. 2003.

Zheng, W. et al., "Analysis and design of quickly starting crystal oscillator", 2015 IEEE 11th Int. Conf. on ASIC (ASICON), Nov. 3-6, 2015.

Vittoz, E., 'Low-Power Crystal and MEMS Oscillators', Springer, 2010, Ch. 6.

Martins, M.A. et al., "A 0.02-to-6GHz SDR Balun-LNA Using a Triple-Stage Inverter-Based Amplifier", 2012 IEEE International Symposium on Circuits and Systems, pp. 472-475.

\* cited by examiner

START-UP CIRCUIT FOR SINGLE-PIN CRYSTAL OSCILLATORS

BACKGROUND

The present disclosure relates generally to integrated circuits, and more particularly, to a start-up circuit for single-pin crystal oscillators with fast start-up capability.

Modern clocking circuits in integrated circuits require stable frequency references (i.e., oscillators) with fast turn-on, small output noise, and low power consumption. Because of stringent frequency stability requirements, an external resonator with a high-quality factor (i.e., a quartz crystal) is typically employed in conjunction with active components in the integrated circuit for generating the reference oscillations. However, because the number of pins available in an integrated circuit for interfacing with other external circuits is limited, it is advantageous to use only one pin for connecting the resonator. Consequently, circuit implementations of oscillators that satisfy the foregoing requirements are challenging, especially in low-supply-voltage environments where the active devices (i.e., transistors) must operate with small headroom voltages.

Accordingly, there exists a need for a start-up circuit that ensures sufficient loop-gain and fast start-up time.

BRIEF DESCRIPTION OF THE DRAWINGS

The present disclosure is illustrated by way of example and not limited in the accompanying figures in which like reference numerals indicate similar elements and in which.

DETAILED DESCRIPTION

Figure 1:
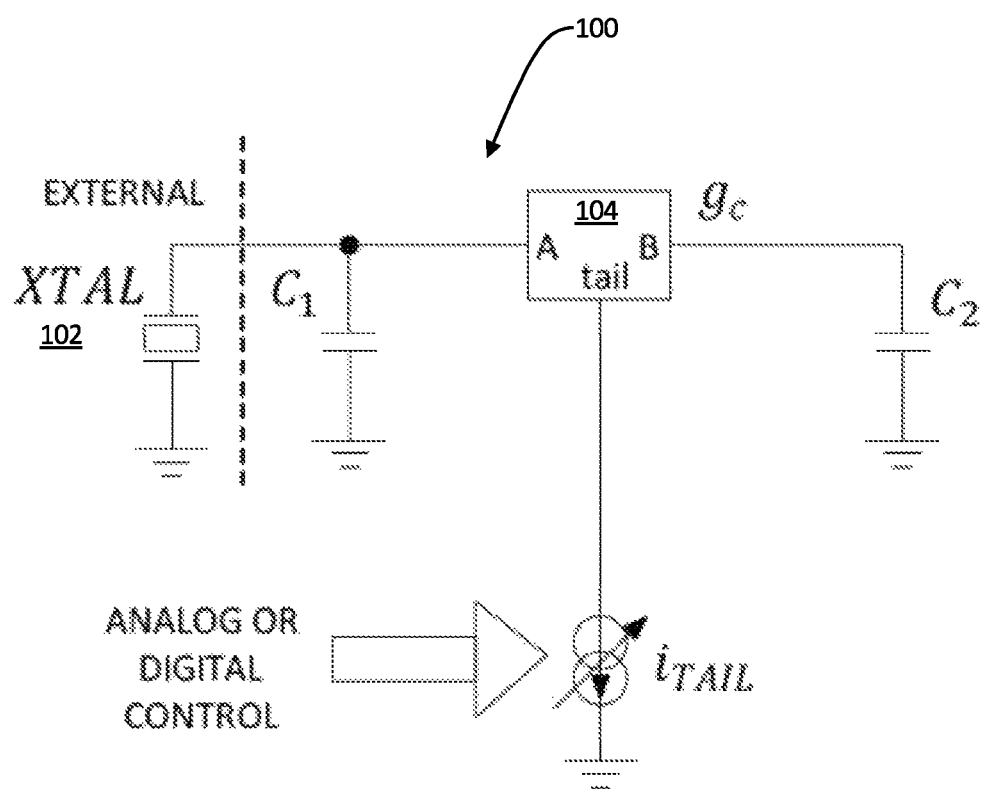
FIG. 1 is a schematic of an exemplary circuit for controlling the loop gain to accelerate the start-up of a one-pin crystal oscillator.

Specific embodiments of the disclosure will now be described in detail regarding the accompanying figures. For simplicity and clarity of illustration, where considered appropriate, reference numerals may be repeated among the figures to indicate corresponding or analogous elements. In addition, numerous specific details are set forth in order to provide a thorough understanding of the examples described herein. However, it will be understood by those of ordinary skill in the art that the examples described herein may be practiced without these specific details. In other instances, well-known methods, procedures and components have not been described in detail so as not to obscure the examples described herein. Also, the description is not to be considered as limiting the scope of the examples described herein.

It will be appreciated that the examples and corresponding diagrams used herein are for illustrative purposes only. Different configurations and terminology can be used without departing from the principles expressed herein. For instance, components and modules can be added, deleted, modified, or arranged with differing connections without departing from these principles.

In the following detailed description of embodiments of the disclosure, numerous specific details are set forth in order to provide a more thorough understanding of the disclosure. However, it will be apparent to those skilled in the art that the disclosure may be practiced without these specific details. In other instances, well-known features have not been described in detail to avoid unnecessarily complicating the description.

It is to be understood that the terminology used herein is for the purposes of describing various embodiments in accordance with the present disclosure and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period.

As used herein, the terms "about" or "approximately" apply to all numeric values, irrespective of whether these are explicitly indicated. Such terms generally refer to a range of numbers that one of skill in the art would consider equivalent to the recited values (i.e., having the same function or result). These terms may include numbers that are rounded to the nearest significant figure. In this document, any references to the term "longitudinal" should be understood to mean in a direction corresponding to an elongated direction of a personal computing device from one terminating end to an opposing terminating end.

In accordance with one embodiment of the present disclosure, there is provided an oscillator start-up circuit. The circuit includes a reference bias switch coupled to a reference node and a load node of a transconductor of an oscillator. The reference bias switch is responsive to a control signal for start-up of the oscillator and operable to close at a first time prior to start-up of the oscillator to maintain a voltage at the reference node equal to a voltage at the load node prior to application of bias to the transconductor. The reference bias switch is further operable to open at a second time subsequent to the first time.

In accordance with a further embodiment, the second time is prior to the application of bias to the transconductor.

In accordance with another embodiment, a first capacitor of the oscillator is coupled to the load node and a second capacitor of the oscillator is coupled to the reference node, and operable to maintain input levels to the transconductor prior to application of bias to the transconductor.

In accordance with yet another embodiment, there is provided a bias current switch responsive to the control signal.

In accordance with still another embodiment, there is provided a delay element in the circuit, the delay element operable to delay the control signal of the bias current switch relative to the second time.

In accordance with another embodiment, the delay element includes one or more inverters.

In accordance with yet another embodiment, the bias current switch includes a MOS transistor coupled to one or more inverters operable to delay the control signal of the bias current switch relative to the second time.

In accordance with a further embodiment, there is provided a source for providing a test signal. The test signal is operably coupled to the reference bias switch where the reference bias switch is open when the test signal is at a first defined logic value and closed at a second defined logic value.

In accordance with still other embodiments, the oscillator is a single-pin crystal oscillator, a van den Homberg oscillator, or the like.

In accordance with another embodiment, there is provided an oscillator start-up circuit including a reference bias switch coupled to a reference node and a load node of a transconductor of an oscillator, where the reference bias switch is responsive to a control signal for start-up of the oscillator. A reference voltage source coupled to the reference node via the reference bias switch, where the reference bias switch operable to close at a first time prior to start-up of the oscillator to maintain a voltage at the reference node equal to a voltage at the load node prior to application of bias to the transconductor. The reference bias switch is further operable to open at a second time subsequent to the first time.

In accordance with yet another embodiment, there is provided a method of oscillator start-up. The method includes: applying a control signal to a reference bias switch coupled to a reference node and a load node of a transconductor of the oscillator to, where the control signal is operable to close the reference bias switch at a first time prior to start-up of the oscillator to maintain a voltage at the reference node equal to a voltage at the load node prior to application of bias to the transconductor, and the control signal is further operable to open the reference bias switch at a second time subsequent to the first time.

Figure 2:
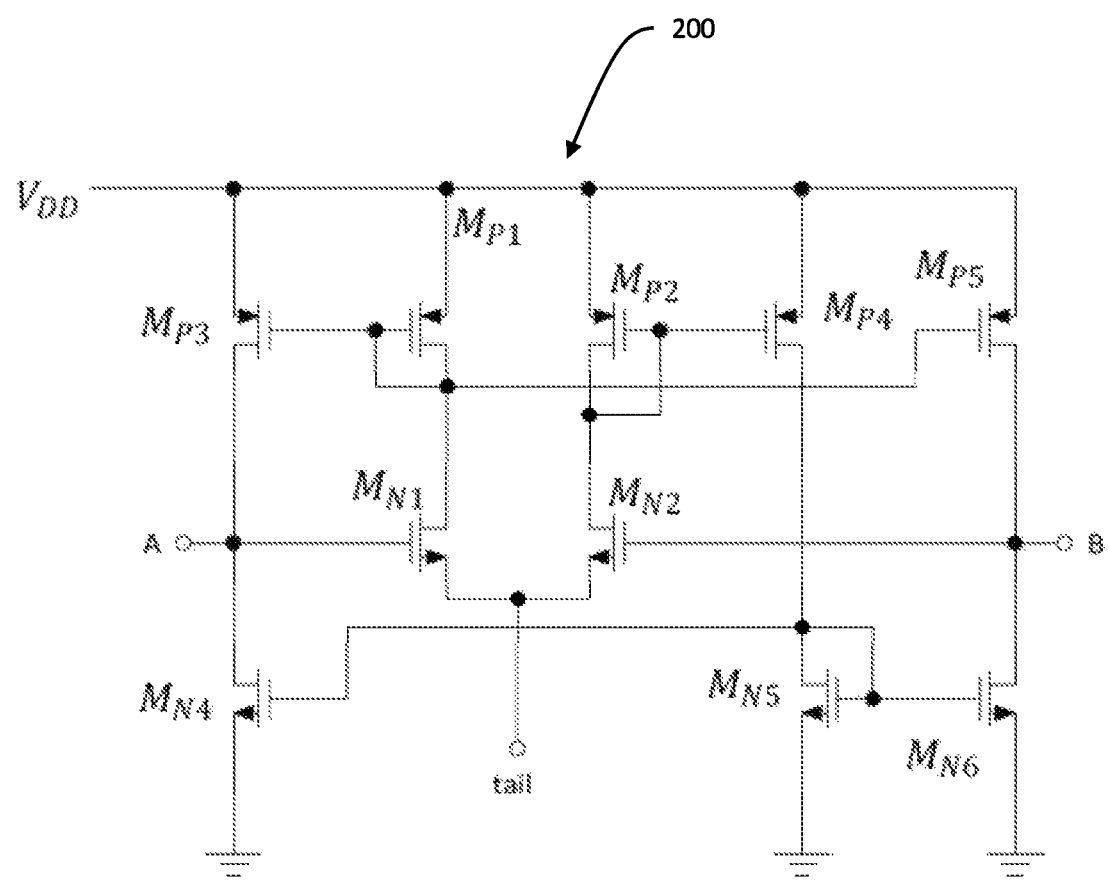
FIG. 2 is a schematic of an illustrative circuit for the transconductance cell shown in FIG. 1.

Referring to FIG. 1, there is depicted an exemplary circuit for controlling the loop gain to accelerate the start-up of a one-pin oscillator 100 having a resonator 102, where $g_c$ is a transconductance cell 104 with output nodes "A" and "B". The oscillator may be, for example, a van den Homberg oscillator. An illustrative circuit 200 for the transconductance cell $g_c$ 104 of FIG. 1 is shown in the schematic diagram of FIG. 2. Circuit 200 comprises a plurality of transistors $M_{P1}, \ldots, M_{P5}$, and $M_{N1}, \ldots, M_{N6}$ arranged as shown. The loop gain is controlled by adjusting the tail current $i_{TAIL}$ applied to $M_{N1}, M_{N2}$ using either analog or digital techniques.

Figure 3:
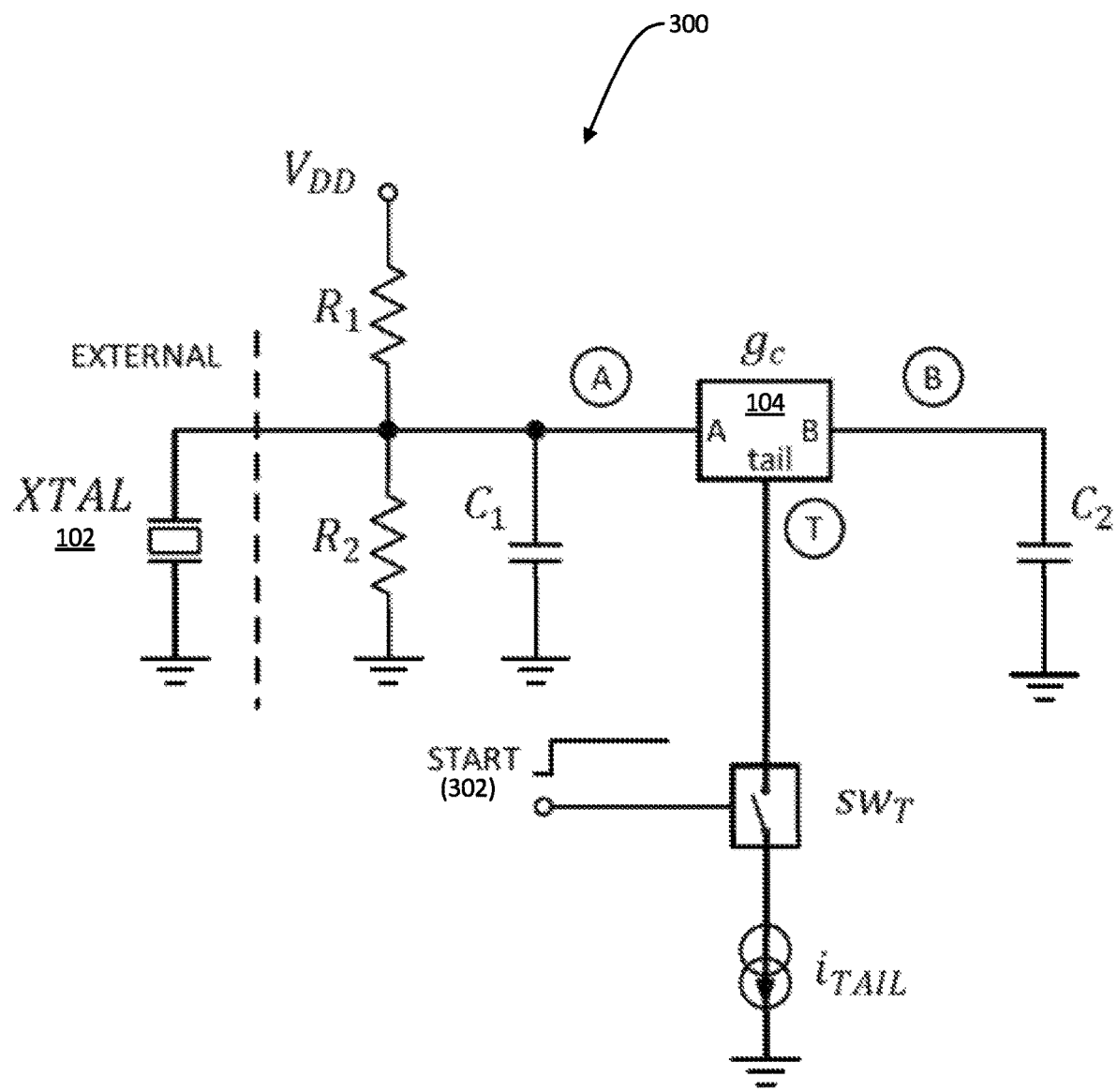
FIG. 3 is a schematic of an oscillator start-up circuit having a switch for selectively applying a programmable tail current to a transconductance cell in response to a digital control signal.

FIG. 3 is a schematic of an oscillator start-up circuit 300 having a switch $SW_T$ for selectively applying a programmable tail current $i_{TAIL}$ to the transconductance cell $g_c$ 104 responsive to a digital START control signal 302. A fixed resistive divider comprising $R_1$-$R_2$ connects the circuit to $V_{DD}$. The common elements from FIG. 1 are provided with like reference numerals for simplicity, as they are shown in the additional drawing figures described below.

Figure 4:
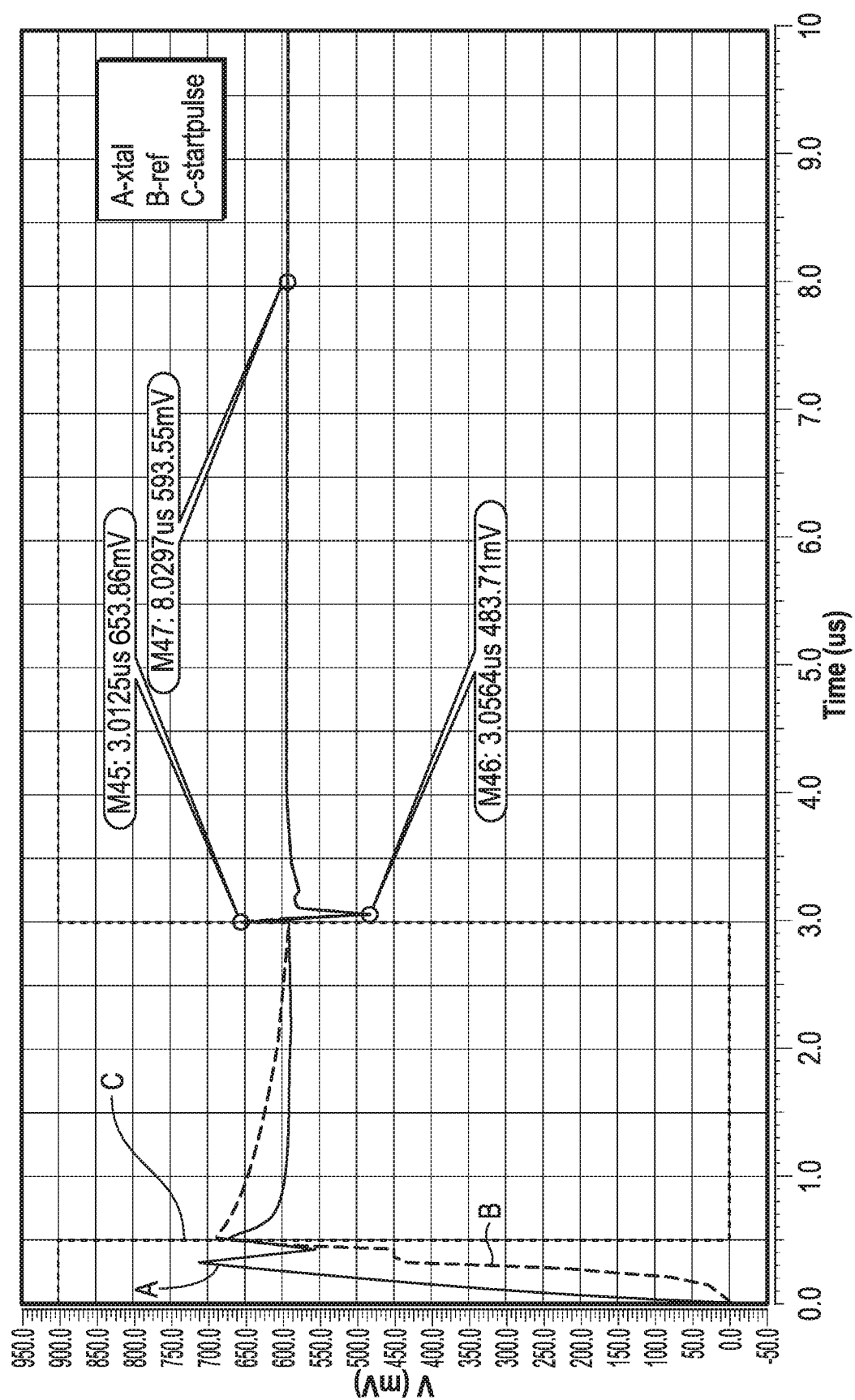
FIG. 4 is a graph that depicts unwanted transients on the capacitors in the circuit of FIG. 3.

FIG. 4 is a graph that depicts unwanted transients on the capacitors $C_1$ and $C_2$ in the circuit of FIG. 3, which can drive the internal transistors (FIG. 2) coupled to these capacitors into non-linear operating regions. This phenomenon has the undesirable effect of reducing the loop-gain and consequently the amount of energy injected into the resonator 102 at the desired operating frequency and can result in a longer start-up time for the oscillation to build up to the desired level.

Figure 5:
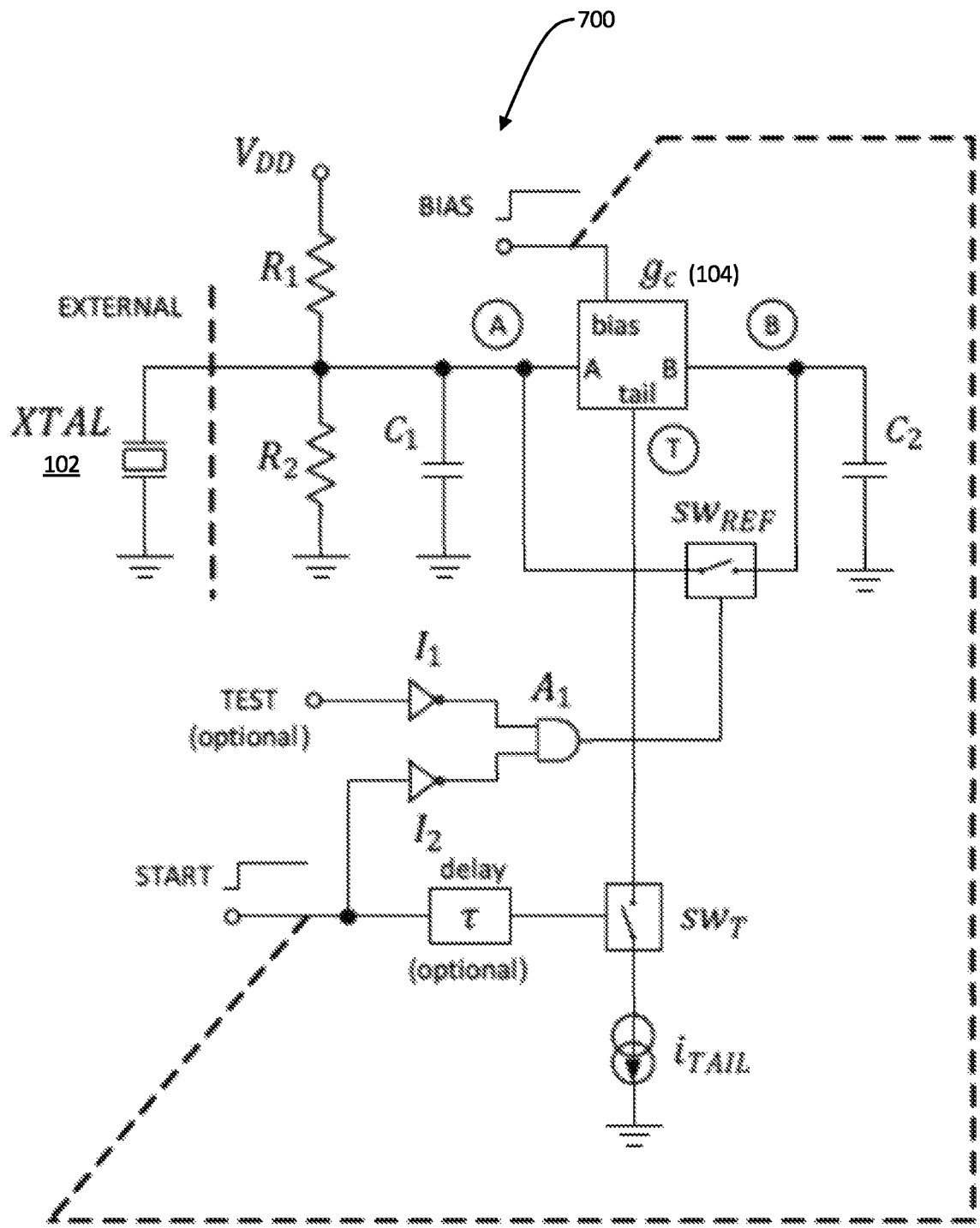
FIG. 5 is a schematic of an oscillator start-up circuit for an oscillator in accordance with an embodiment of the present disclosure.

With reference now to FIG. 5, there is illustrated a schematic of an oscillator start-up circuit 700 for an oscillator 100 in accordance with an embodiment of the present disclosure. The circuit 700 includes common elements from the circuit of FIG. 3 and adds a reference bias switch $SW_{REF}$ that is responsive to the digital START control signal 302 for start-up of the oscillator. The reference bias switch is operable to close at a first time prior to start-up of the oscillator 102 to maintain a voltage at the reference node B equal to a voltage at the load node A prior to application of bias to the transconductance cell $g_c$ 104. The reference bias switch $SW_{REF}$ is operable to open at a second time subsequent to the first time. In this regard, a synchronous or slightly delayed (relative to BIAS) START step signal is applied via an optional delay element τ to tail current switch $SW_T$ and $SW_{REF}$ via inverter $I_2$ (AND gate $A_1$ is provided for an optional TEST signal) such that $SW_{REF}$ is operable to close when START is at a first logic level (i.e., zero, no start), and open when START is at a second logic level (i.e., one, start-up). The delay element may consist of one or more inverters. In this manner, the inputs of transconductor cell $g_c$ 104 are maintained at the levels present in normal operation by capacitors $C_1$ and $C_2$ immediately after $SW_{REF}$ opens and the circuit 700 is ready to accept a start-up tail current $i_{TAIL}$ pulse via switch $SW_T$. Consequently, the transient voltages at the inputs of the transconductor cell $g_c$ 104 are minimized, and thus fast oscillation build-up occurs as the components of the transconductor cell $g_c$ 104 operate in the active/linear region. The optional TEST signal may be applied via inverter $I_1$ and AND gate $A_1$, such that when $SW_{REF}$ is open, the TEST signal is at logic one (e.g., to implement functions such as BIST ("built-in self-test")).

Figure 6:
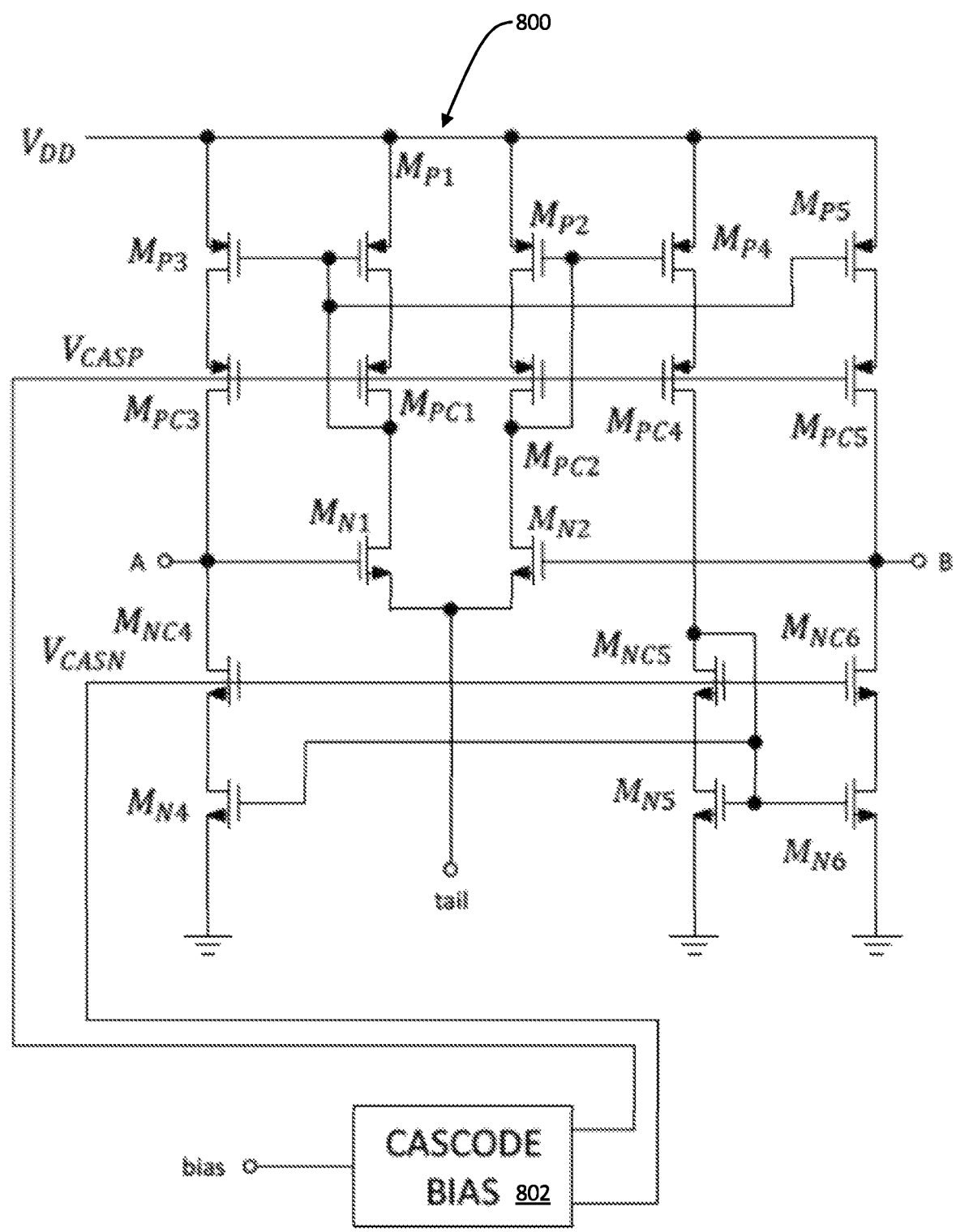
FIG. 6 is an embodiment of a transconductor circuit that requires internal bias voltages for the cascodes in the circuit.

Referring now to FIG. 6, there is illustrated an embodiment of a transconductor circuit 800 that requires internal bias voltages for the cascodes. As shown, the cascode bias is represented generally by block 802, which is coupled to transistors $M_{PC3}$, $M_{PC1}$ $M_{PC4}$ $M_{PC5}$ and $M_{NC4}$, $M_{NC5}$ and $M_{NC6}$. The cascodes and general arrangements of the transconductor cells are disclosed in more detail in U.S. patent application Ser. No. 15/695,493 filed on Sep. 5, 2017, assigned to the Assignee of the present application and incorporated by reference herein.

Figure 7:
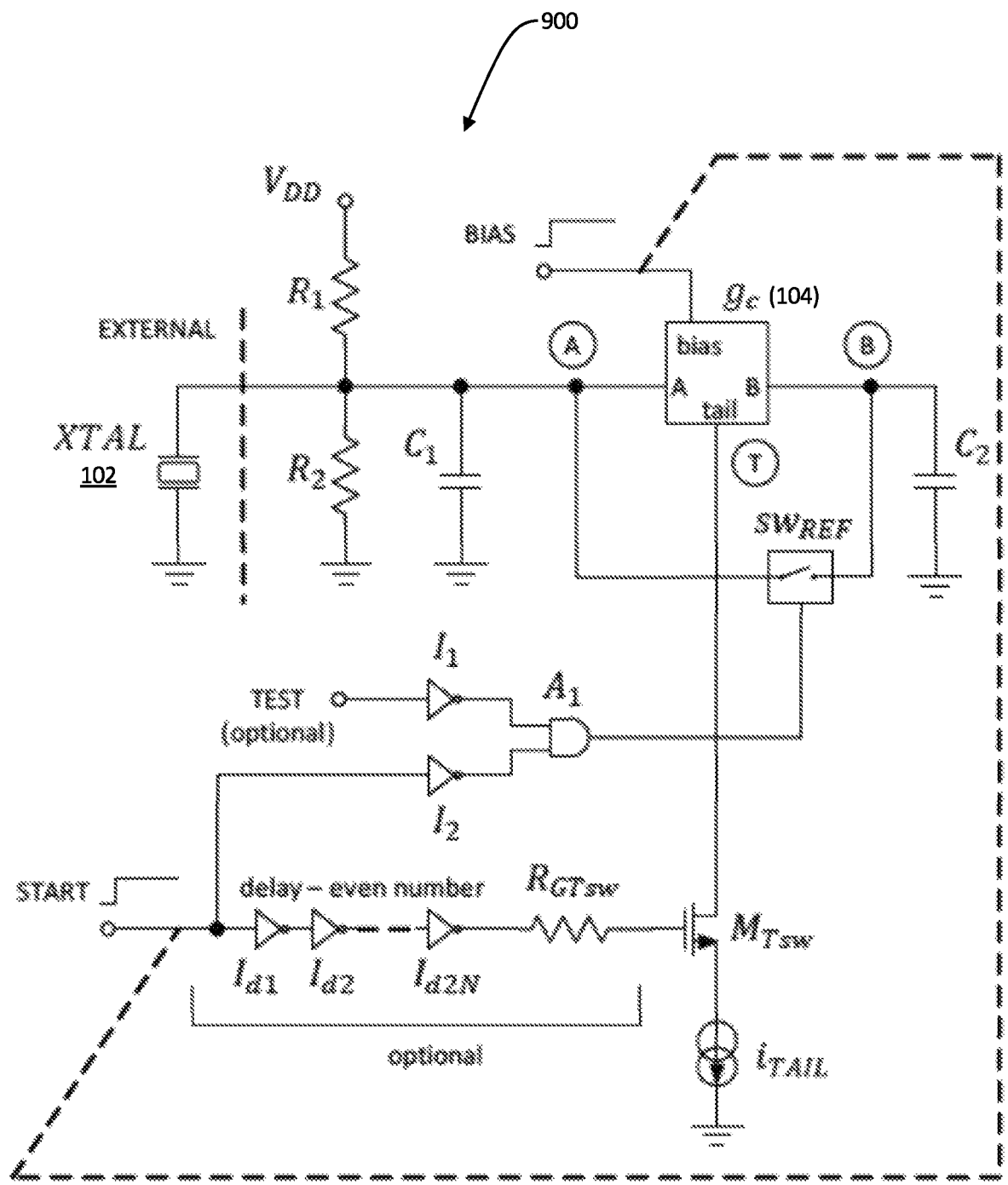
FIG. 7 is a schematic of an oscillator start-up circuit that contains a modification of the oscillator start-up circuit of FIG. 5.

FIG. 7 is an oscillator start-up circuit 900 that contains a modification of the oscillator start-up circuit 700 of FIG. 5. Circuit 900 includes a delay element r consisting of a plurality (even-number) of inverters $I_{d1}, I_{d2} \ldots I_{dN}$ coupled to a resistor $R_{GTsw}$ and MOS transistor $M_{Tsw}$. In this embodiment, the function of the switch $SW_T$ is provided by the combination of $R_{GTsw}$ and $M_{Tsw}$. This arrangement prevents supply noise from being injected into the transconductor cell $g_c$ 104 post start-up during normal operation.

Figure 8:
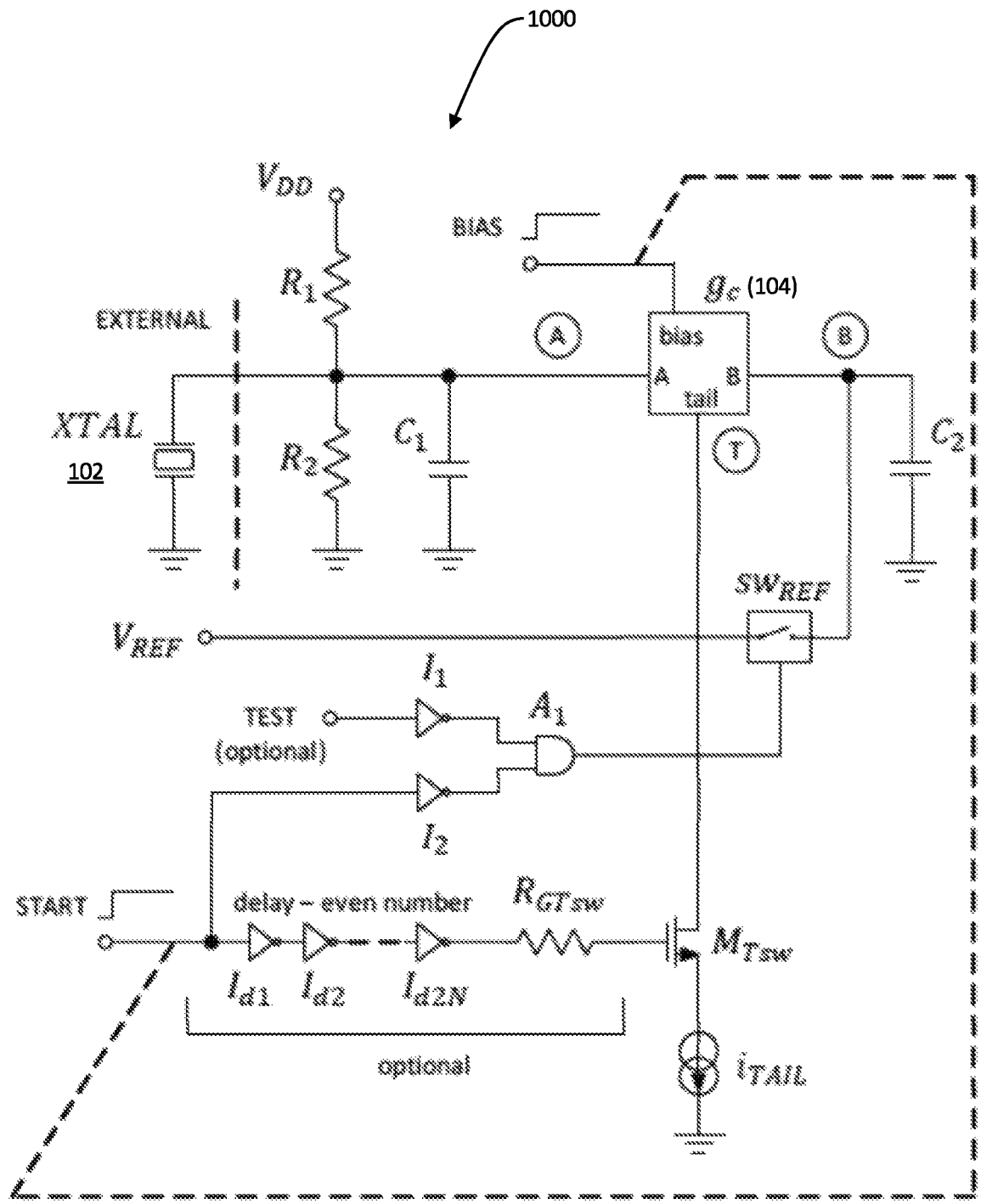
FIG. 8 is a schematic of an oscillator start-up circuit in accordance with another embodiment of the disclosure.

With reference now to FIG. 8, there is illustrated an oscillator start-up circuit 1000 in accordance with another embodiment of the disclosure. Circuit 1000 contains similar elements as circuit 900 of FIG. 7, with a modification where an additional reference voltage V REF is applied to the oscillator reference node B of the transconductance cell $g_c$ 104 prior to the application of the START pulse.

Figure 9:
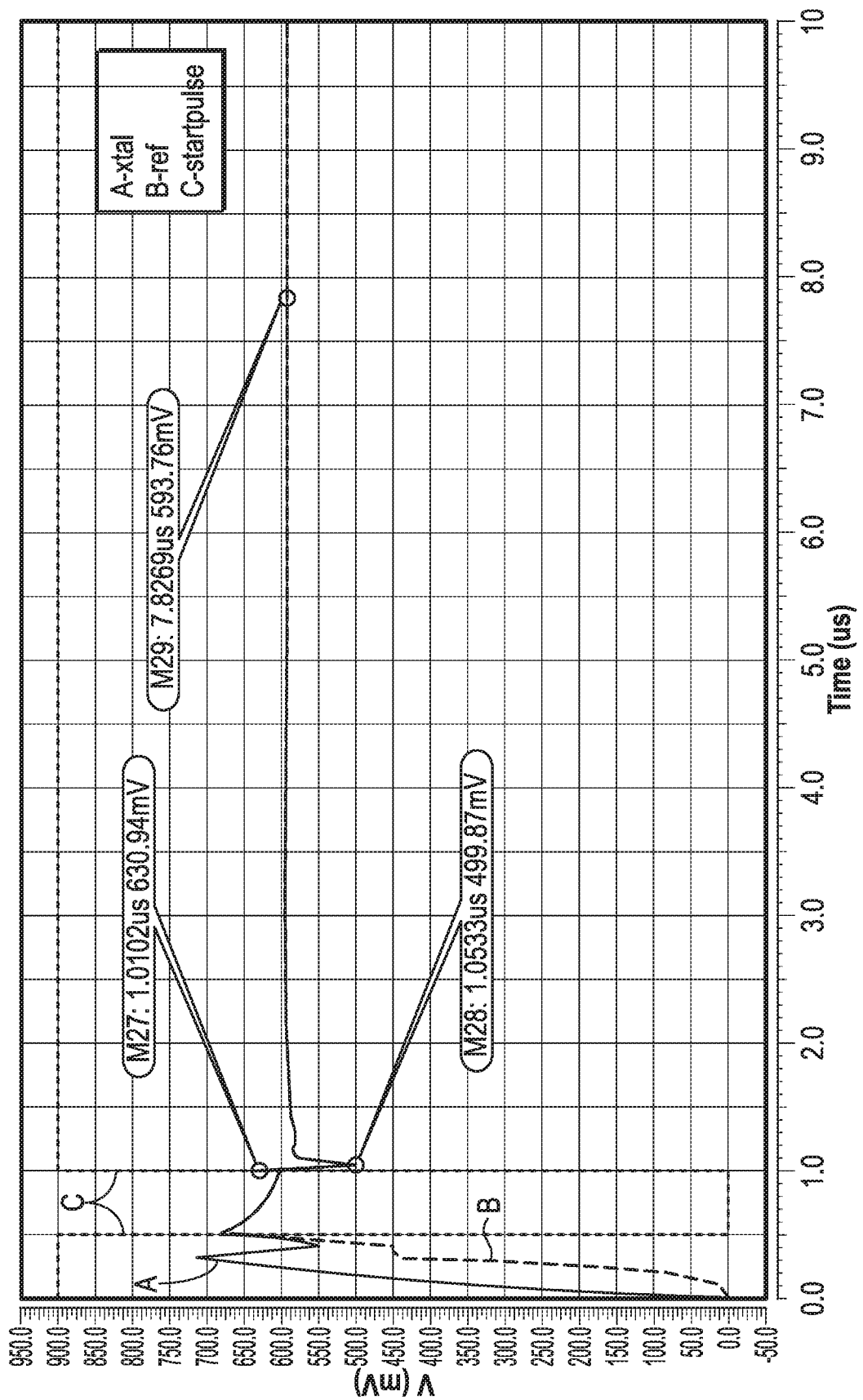
FIGS. 9, 10 and 11 depict illustrative transient waveforms at the inputs of a transconductance cell using the circuits and methods in accordance with the present disclosure.
Figure 10:
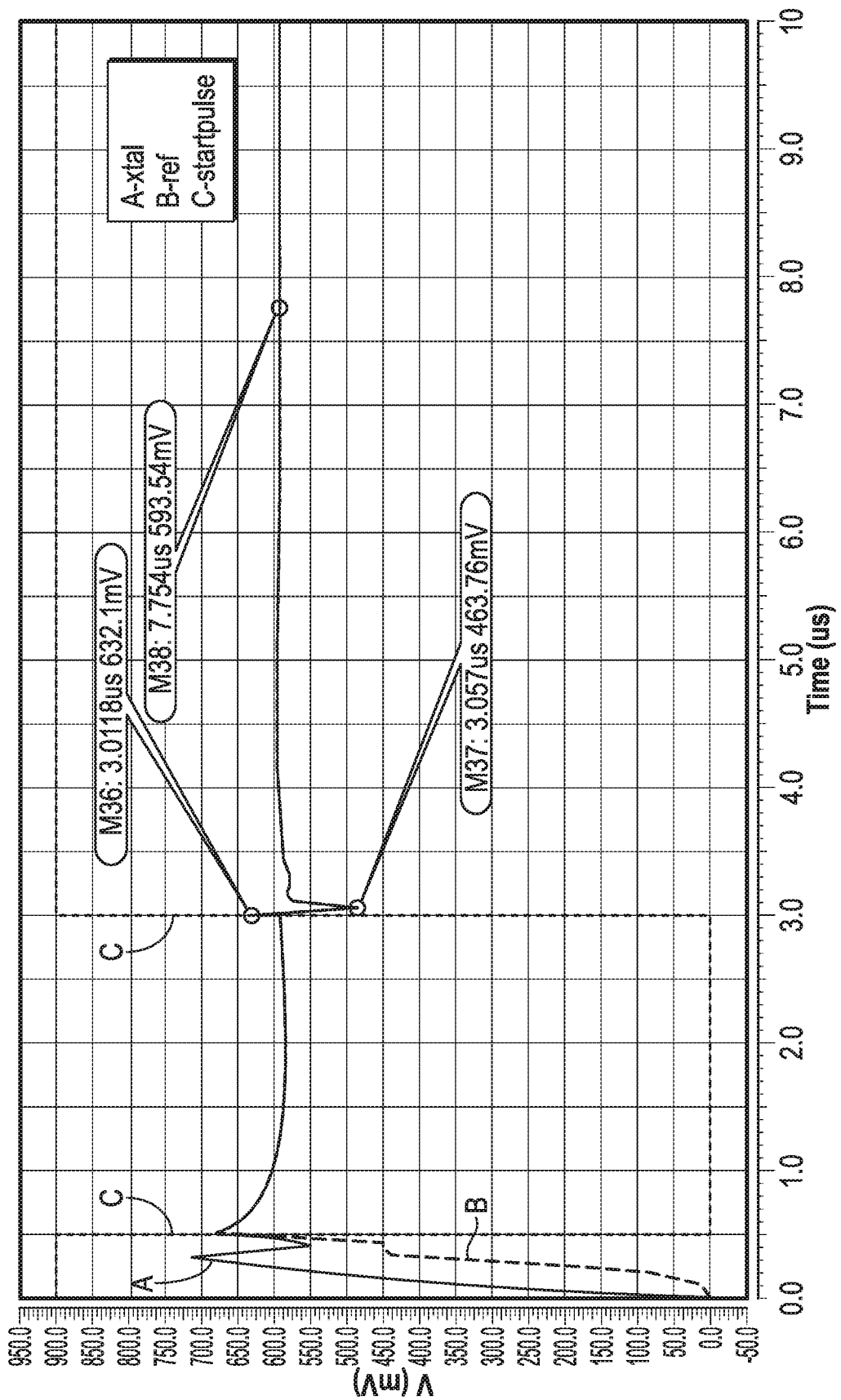
Figure 11:
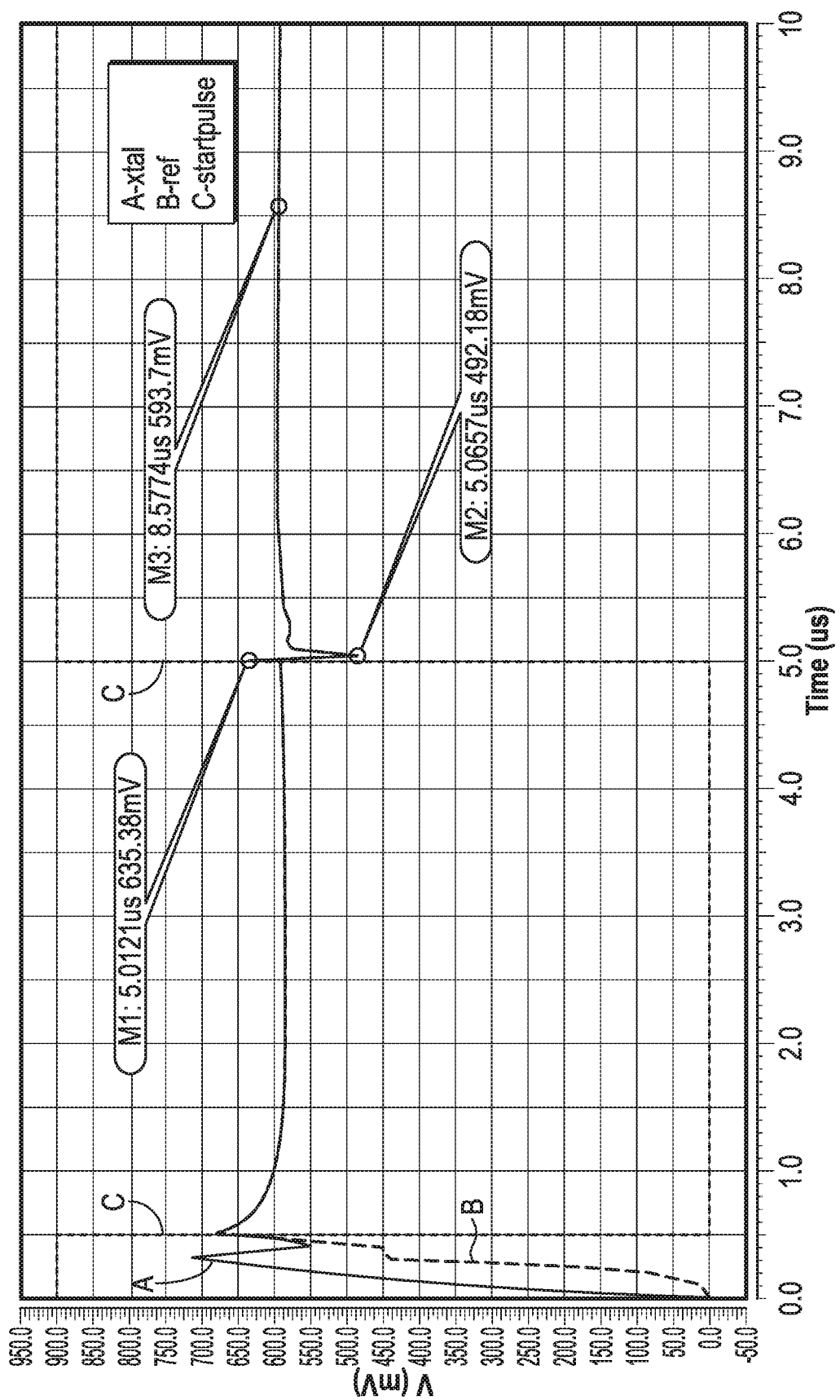

FIGS. 9, 10 and 11 depict illustrative transient waveforms at the inputs of the transconductance cell $g_c$ 104 (nodes A and B) using the circuits and methods in accordance with the present disclosure. These graphs demonstrate advantageous minimal overshoot/undershoot irrespective of the pulse profile.

The terms "program," "software application," and the like, as used herein, are defined as a sequence of instructions designed for execution on a computer system. A "program," "computer program," or "software application" may include a subroutine, a function, a procedure, an object method, an object implementation, an executable application, an applet, a servlet, a source code, an object code, a shared library/dynamic load library and/or other sequence of instructions designed for execution on a computer system.

The present disclosure may be embodied within a system, a method, a computer program product or any combination thereof. The computer program product may include a computer readable storage medium or media having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing.

Reference in the specification to "one embodiment" or "an embodiment" means that a particular feature, structure, or characteristic described in connection with the embodiment is included in at least one embodiment of the system. The appearances of the phrase "in one embodiment" in various places in the specification are not necessarily all referring to the same embodiment.

Embodiments of the present disclosure are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

Some portions of the detailed descriptions, like the processes may be presented in terms of algorithms and symbolic representations of operations on data bits within a computer memory. An algorithm may be generally conceived to be steps leading to a desired result. The steps are those requiring physical transformations or manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The operations described herein can be performed by an apparatus. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk, read-only memories (ROMs), random access memories (RAMs), EPROMs, EEPROMs, magnetic or optical cards, or any type of media suitable for storing electronic instructions. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on one computer, partly on the computer, as a stand-alone software package, partly on the first computer and partly on a remote computer or entirely on the remote computer or server. In the latter scenario, the remote computer may be connected to the first computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry to perform embodiments of the present disclosure.

Accordingly, embodiments and features of the present disclosure are set out in the following numbered items:

1. An oscillator start-up circuit, including: a reference bias switch coupled to a reference node and a load node of a transconductor of an oscillator, the reference bias switch being responsive to a control signal for start-up of the oscillator, the reference bias switch operable to close at a first time prior to start-up of the oscillator to maintain a voltage at the reference node equal to a voltage at the load node prior to application of bias to the transconductor, the reference bias switch operable to open at a second time subsequent to the first time.

2. The oscillator start-up circuit of item 1, where the second time is prior to the application of bias to the transconductor.

3. The oscillator start-up circuit of item 1, where a first capacitor of the oscillator is coupled to the load node and a second capacitor of the oscillator is coupled to the reference node operable to maintain input levels to the transconductor prior to application of bias to the transconductor.

4. The oscillator start-up circuit of item 1, further including a bias current switch responsive to the control signal.

5. The oscillator start-up circuit of item 4, further including a delay element operable to delay the control signal of the bias current switch relative to the second time.

6. The oscillator start-up circuit of item 5, where the delay element comprises one or more inverters.

7. The oscillator start-up circuit of item 4, where the bias current switch comprises a MOS transistor coupled to one or more inverters operable to delay the control signal of the bias current switch relative to the second time.

8. The oscillator start-up circuit of item 1, further including a source for providing a test signal, the test signal operably coupled to the reference bias switch where the reference bias switch is open when the test signal is at a first defined logic value and closed at a second defined logic value.

9. The oscillator start-up circuit of item 1, where the oscillator is a single-pin crystal oscillator.

10. The oscillator start-up circuit of item 1, where the oscillator is a van den Homberg oscillator.

11. An oscillator start-up circuit, including: a reference bias switch coupled to a reference node and a load node of a transconductor of an oscillator, the reference bias switch being responsive to a control signal for start-up of the oscillator; and a reference voltage source coupled to the reference node via the reference bias switch, the reference bias switch operable to close at a first time prior to start-up of the oscillator to maintain a voltage at the reference node equal to a voltage at the load node prior to application of bias to the transconductor, the reference bias switch operable to open at a second time subsequent to the first time.

12. The oscillator start-up circuit of item 11, where the second time is prior to the application of bias to the transconductor.

13. The oscillator start-up circuit of item 11, where a first capacitor of the oscillator is coupled to the load node and a second capacitor of the oscillator is coupled to the reference node operable to maintain input levels to the transconductor prior to application of bias to the transconductor.

14. The oscillator start-up circuit of item 11, further including a bias current switch responsive to the control signal.

15. The oscillator start-up circuit of item 14, further comprising a delay element operable to delay the control signal of the bias current switch relative to the second time.

16. The oscillator start-up circuit of item 15, where the delay element comprises one or more inverters.

17. The oscillator start-up circuit of item 14, where the bias current switch includes a MOS transistor coupled to one or more inverters operable to delay the control signal of the bias current switch relative to the second time.

18. The oscillator start-up circuit of item 11, further comprising a source for providing a test signal, the test signal operably coupled to the reference bias switch where the reference bias switch is open when the test signal is at a first defined logic value and closed at a second defined logic value.

19. The oscillator start-up circuit of item 11, where the oscillator is a single-pin crystal oscillator.

20. The oscillator start-up circuit of item 11, where the oscillator is a van den Homberg oscillator.

21. A method of oscillator start-up, the method including: applying a control signal to a reference bias switch coupled to a reference node and a load node of a transconductor of the oscillator to: close the reference bias switch at a first time prior to start-up of the oscillator to maintain a voltage at the reference node equal to a voltage at the load node prior to application of bias to the transconductor; and open the reference bias switch at a second time subsequent to the first time.

22. The method of oscillator start-up of item 21, where the second time is prior to the application of bias to the transconductor.

23. The method of oscillator start-up of item 21, further comprising introducing a first capacitance of the oscillator at the load node and a second capacitance of the oscillator at the reference node to maintain input levels to the reference node and the load node of the transconductor prior to application of bias to the transconductor.

24. The method of oscillator start-up of item 21, further including delaying a start signal relative to the second time.

25. The method of oscillator start-up of item 21, further including applying a test signal to the reference bias switch where the reference bias switch is open when the test signal is at a first defined logic value and closed at a second defined logic value.

26. The method of oscillator start-up of item 21, further including applying a reference voltage to the reference node via the reference bias switch.

27. The method of oscillator start-up of item 21, where the oscillator is a single-pin crystal oscillator.

28. The method of oscillator start-up of item 21, where the oscillator is a van den Homberg oscillator.

In accordance with the foregoing, an oscillator start-up circuit and methodology is disclosed. Having thus described the invention of the present application in detail and by reference to embodiments thereof, it will be apparent that modifications and variations are possible without departing from the scope of the invention defined in the appended claims as follows:

I claim:

1. An oscillator start-up circuit, comprising:
a reference bias switch coupled to a reference node and a load node of a transconductor of an oscillator, the reference bias switch being responsive to a control signal for start-up of the oscillator,
the reference bias switch operable to close at a first time prior to start-up of the oscillator to maintain a voltage at the reference node equal to a voltage at the load node prior to application of bias to the transconductor, the reference bias switch operable to open at a second time subsequent to the first time;
a bias current switch responsive to the control signal; and
a delay element operable to delay the control signal of the bias current switch relative to the second time.

2. The oscillator start-up circuit of claim 1, where the second time is prior to the application of bias to the transconductor.

3. The oscillator start-up circuit of claim 1, where a first capacitor of the oscillator is coupled to the load node and a second capacitor of the oscillator is coupled to the reference node operable to maintain input levels to the transconductor prior to application of bias to the transconductor.

4. The oscillator start-up circuit of claim 1, further comprising a source for providing a test signal, the test signal operably coupled to the reference bias switch where the reference bias switch is open when the test signal is at a first defined logic value and closed at a second defined logic value.

5. An oscillator start-up circuit, comprising:
 a reference bias switch coupled to a reference node and a load node of a transconductor of an oscillator, the reference bias switch being responsive to a control signal for start-up of the oscillator;
 a reference voltage source coupled to the reference node via the reference bias switch,
 the reference bias switch operable to close at a first time prior to start-up of the oscillator to maintain a voltage at the reference node equal to a voltage at the load node prior to application of bias to the transconductor, the reference bias switch operable to open at a second time subsequent to the first time;
 a bias current switch responsive to the control signal; and
 a delay element operable to delay the control signal of the bias current switch relative to the second time.

6. The oscillator start-up circuit of claim 5, where the second time is prior to the application of bias to the transconductor.

7. The oscillator start-up circuit of claim 5, where a first capacitor of the oscillator is coupled to the load node and a second capacitor of the oscillator is coupled to the reference node operable to maintain input levels to the transconductor prior to application of bias to the transconductor.

8. The oscillator start-up circuit of claim 5, where the bias current switch comprises a MOS transistor coupled to one or more inverters operable to delay the control signal of the bias current switch relative to the second time.

9. The oscillator start-up circuit of claim 5, further comprising a source for providing a test signal, the test signal operably coupled to the reference bias switch where the reference bias switch is open when the test signal is at a first defined logic value and closed at a second defined logic value.

10. The oscillator start-up circuit of claim 5, where the oscillator is a single-pin crystal oscillator.

11. A method of oscillator start-up, the method comprising:
 applying a control signal to a reference bias switch coupled to a reference node and a load node of a transconductor of the oscillator to:
 close the reference bias switch at a first time prior to start-up of the oscillator to maintain a voltage at the reference node equal to a voltage at the load node prior to application of bias to the trans conductor; and
 open the reference bias switch at a second time subsequent to the first time and
 delaying a start signal relative to the second time.

12. The method of oscillator start-up of claim 11, where the second time is prior to the application of bias to the transconductor.

13. The method of oscillator start-up of claim 11, further comprising introducing a first capacitance of the oscillator at the load node and a second capacitance of the oscillator at the reference node to maintain input levels to the reference node and the load node of the transconductor prior to application of bias to the transconductor.

14. The method of oscillator start-up of claim 11, further including applying a test signal to the reference bias switch where the reference bias switch is open when the test signal is at a first defined logic value and closed at a second defined logic value.

15. The method of oscillator start-up of claim 11, further comprising applying a reference voltage to the reference node via the reference bias switch.

* * * * *